(12) United States Patent
Kawasaki

(10) Patent No.: US 7,847,622 B2
(45) Date of Patent: Dec. 7, 2010

(54) ELECTRIC CIRCUIT DEVICE

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 12/396,861

(22) Filed: Mar. 3, 2009

(65) Prior Publication Data

US 2009/0219083 A1 Sep. 3, 2009

(30) Foreign Application Priority Data

Mar. 3, 2008 (JP) .............................. 2008-051639
Feb. 12, 2009 (JP) .............................. 2009-030286

(51) Int. Cl.
*G05F 1/10* (2006.01)

(52) U.S. Cl. .................... 327/540; 327/77; 327/88; 327/387; 323/282; 323/284

(58) Field of Classification Search .............. 327/77–78, 327/81, 88, 387–388, 379, 381–383, 538, 327/540–541; 323/273, 280, 282–284

See application file for complete search history.

(56) References Cited

U.S. PATENT DOCUMENTS 5,164,659 A * 11/1992 Schultz et al. .............. 323/351
6,049,200 A *  4/2000 Hayashimoto .............. 323/269
7,106,034 B2 *  9/2006 Chien et al. ................. 323/281
7,205,827 B2 *  4/2007 Leung et al. ................ 327/540

OTHER PUBLICATIONS

Philippe, Royannez et al.,"90nm Low Leakage SoC Design Techniques for Wireless Applications",*ISSCC 2005 / Session 7 / Multimedia Processing / 7.6* Feb. 7, 2005.

Yusuke, Kanno et al.,"Hierarchical Power Distribution with 20 Power Domains in 90-nm Low-Power Multi-CPU Processor",*ISSCC 2006 / Session 29 / Power Management and Distribution / 29.4* Feb. 8, 2006.

* cited by examiner

*Primary Examiner*—An T Luu
(74) *Attorney, Agent, or Firm*—Fujitsu Patent Center

(57) ABSTRACT

An electric circuit device includes: a power supply line; a load circuit; a current supply controller which compares a voltage of the power supply line with a certain voltage; and a current supply circuit which supplies a electric current from the power supply line to the load circuit and changes the electric current during a supply of the electric current.

9 Claims, 16 Drawing Sheets

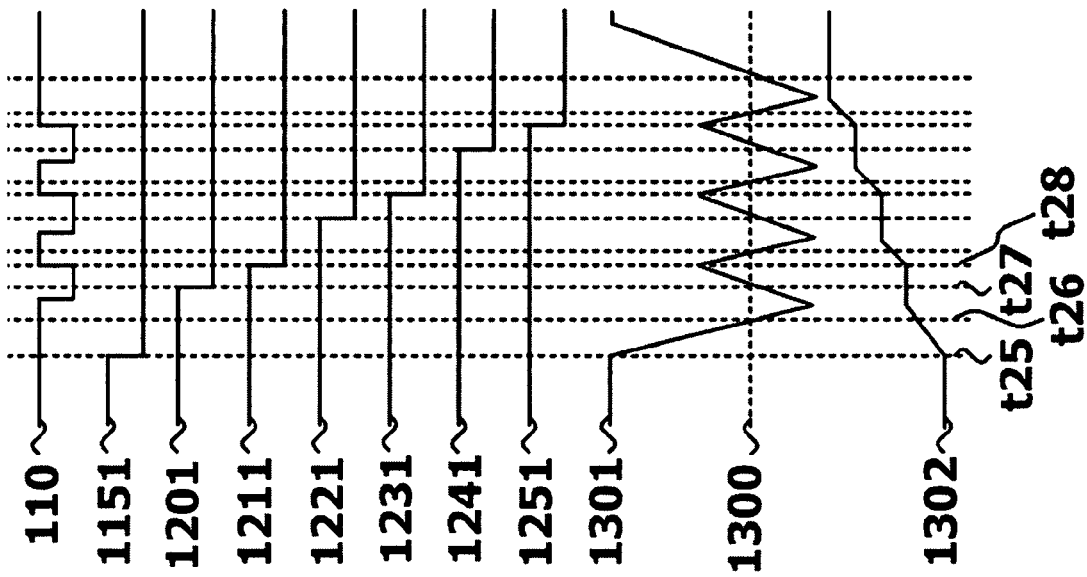

ELECTRIC CIRCUIT DEVICE

CROSS-REFERENCE TO RELATED APPLICATION

This application is based upon and claims the benefit of priority of the prior Japanese Patent Application No. 2008-051639 filed on Mar. 3, 2008 and Japanese Patent Application No. 2009-030286 filed on Feb. 12, 2009, the entire contents of which are incorporated herein by reference.

BACKGROUND

1. Field

The embodiments discussed herein are directed to an electric circuit device that supplies power to a load circuit in the electric device.

2. Description of the Related Art

One of functions to reduce power consumption of a semiconductor integrated circuit used in an electric apparatus is power gating. The power gating stops the power supply to a specific block of the load circuit in a standby state. Thus, unnecessary power consumption of the specific block in a standby state is reduced and hours of operation of a portable electric apparatus increase.

The load circuit in the semiconductor integrated circuit includes a logic circuit including a capacitive component such as a parasitic capacitance of a transistor and a capacitive element for stabilizing a power supply voltage of the logic circuit. When connection of the load circuit with the power source is interrupted, electric charge that is charged in the capacitive component of the load circuit may be discharged by a leakage current in the load circuit. Therefore, when the load circuit is coupled to the power source again, the capacitive component in the load circuit may be charged. Since an electric rush current flows into the capacitive component, a power supply voltage decreases and the operation of the load circuit becomes unstable.

Related arts are described in Y. Kanno et al., "Hierarchical Power Distribution with 20 Power Domains in 90-nm Low-Power Multi-CPU Processor", ISSCC Dig. Tech. Papers, pp. 540-541, February, 2006 and in P. Royannez et al., "90 nm Low Leakage SoC Design Techniques for Wireless Applications", ISSCC Dig. Tech. Papers, pp. 138-139, February, 2005.

SUMMARY

According to an aspect of an embodiment, an electric circuit device is provided which includes a power supply line; a load circuit; a current supply controller which compares a voltage of the power supply line with a certain voltage; and a current supply circuit which supplies a electric current from the power supply line to the load circuit and changes the electric current during a supply of the electric current.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 16 illustrates another exemplary operation of a current supply circuit

DESCRIPTION OF THE PREFERRED EMBODIMENTS

Figure 1:
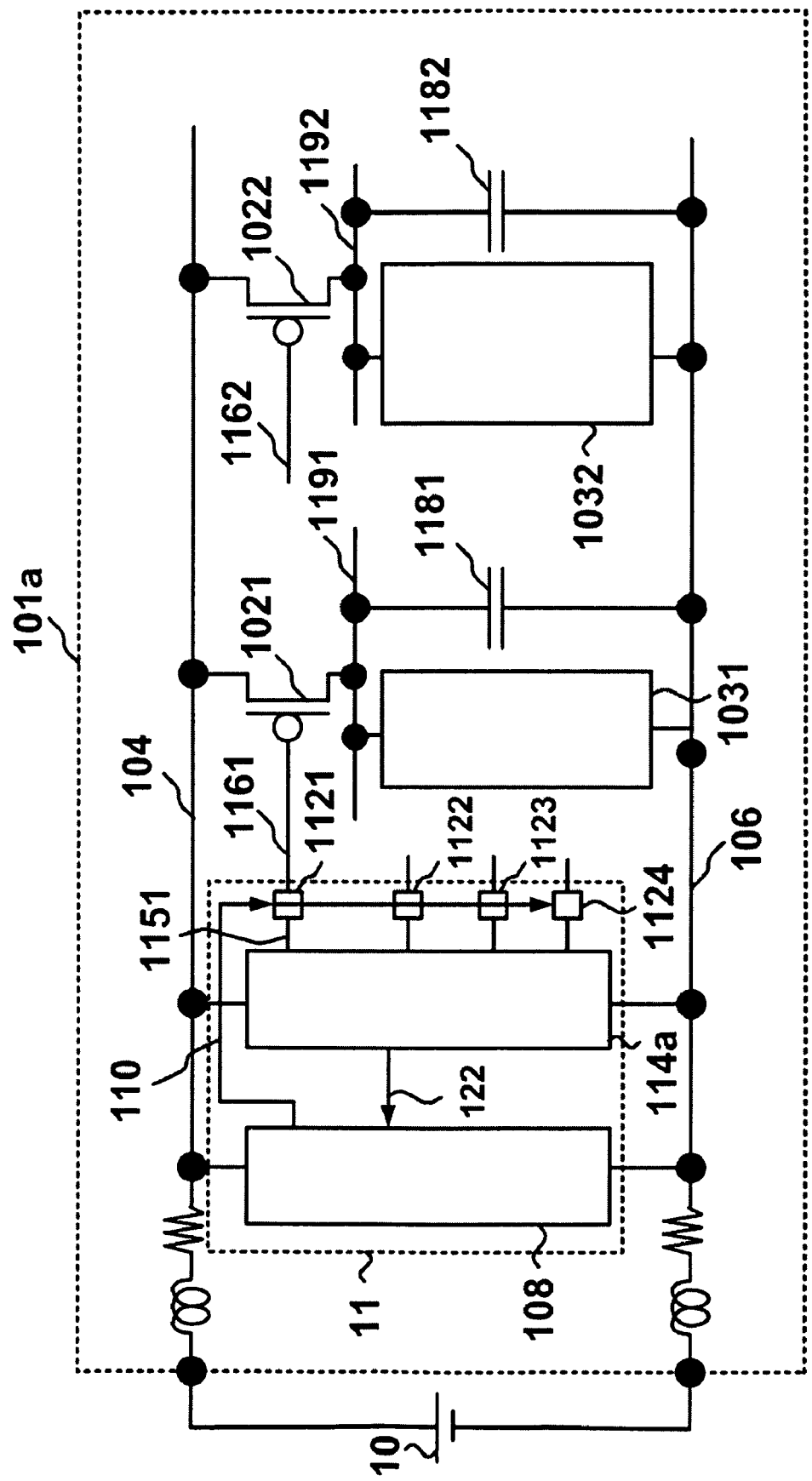
FIG. 1 illustrates a first embodiment.

FIG. 1 illustrates a first embodiment. FIG. 1 illustrates an electric circuit device 101a which may be included in a semiconductor integrated circuit.

The electric circuit device 101a includes a current supply controller 11, load circuits 1031 and 1032, transistor 1021 and 1022, a power supply line 104, a power supply line 106 and power supply lines 1191 and 1192. The current supply controller 11 monitors a voltage of the power supply line 104 and compares the monitored voltage with a certain threshold voltage to output a comparison result. The current supply controller 11 includes a detector 108, a transistor controller 114a, and drivers 1121, 1122, 1123 and 1124. A current from the power supply line 104 is supplied to the load circuits 1031 and 1032 via the transistors 1021 and 1022. The transistors 1021 and 1022 may be a current supply circuit that changes an amount of the current according to the comparison result. The electric circuit device 101a includes a plurality of load circuits and controls each load circuit independently. Load circuits may be different in power consumption. In this embodiment, the electric circuit device 101a includes four load circuits.

Note that the electric circuit device 101a is not limited to a circuit mounted on a semiconductor integrated circuit, and it may be a circuit mounted on a printed substrate.

The power supply lines 104 and 106 are used for supplying the electric circuit device 101a with power. The power supply line 104 couples to a power source 10. The power supply line 106 may be a low-voltage power source, such as a ground.

The load circuits 1031 and 1032 may be provided in the electric circuit device 101a. The load circuits 1031 and 1032 belong to independent power supply domains. Supply and stop of power from the power source 10 are controlled by a power gating control. A power supply targets are not limited to load circuits in an electric circuit device. Load circuits in a printed circuit substrate may be power-supplied. The power supply lines 104, 106, 1191, 1192, 1193, and 1194 may be wires. Each of capacitive elements 1181 and 1182 is arranged in the substantially same power supply domain as the corresponding load circuits 1031 and 1032 and is coupled in parallel with each of load circuit 1031 and 1032. Each of capacitive elements 1181 and 1182 is used to stabilize a voltage applied to the corresponding load circuits 1031 and 1032. Parasitic capacitances of the load circuits 1031 and 1032 may be used to stabilize the voltage applied to the corresponding load circuits 1031 and 1032.

Each of the transistor 1021 and 1022 includes a corresponding capacitance component which reduces fluctuation in voltages of driving signals 1161 and 1162 while an electric current supplied to the corresponding load circuits 1031 and 1032 from the corresponding power supply line 1191 or 1192 is changed in accordance with the driving signals 1161 and 1162 and the driving signals 1161 and 1162 are stable. Each of the transistors 1021 and 1022 is coupled to the power supply line 104 and the corresponding power supply lines 1191 and 1192. The transistors 1021 and 1022 may be, for example, transistors. The allowable values of electric current that flow through the transistors 1021 and 1022 vary depending on the circuit sizes of the load circuits 1031 and 1032. The gate capacitances when the transistors 1021 and 1022 may be MOS transistors vary depending on the allowable values of electric currents of the MOS transistors. The transistors 1021 and 1022 may be current control circuits that control the amount of power supply to the load circuits 1031 and 1032 in response to the driving signal 1161 and 1162. The transistors 1021 and 1022 may be switches where the electric currents that flow from the power supply line 104 to the load circuits 1031 and 1032 are changed in accordance with the driving signals 1161 and 1162.

The detector 108 detects fluctuations in power supply voltage supplied to the power supply line 104. The detector 108 is coupled to the power supply lines 104 and 106, and outputs a detection signal 110 in accordance with fluctuations in power supply voltage. The detector 108 operates or stops by receiving an activation signal 122 output from the transistor controller 114*a*.

The driver 1121 compares the voltage of the power supply line 104 with a certain threshold voltage. The driver 1121 outputs the driving signal 1161, the voltage of which changes continuously based on the comparison result, and stops outputting the driving signal 1161. The driver 1121 receives signal 1151 from the transistor controller 114*a* to output the driving signal 1161 electric.

The transistor controller 114*a* outputs the signal 1151, which drives and stops the load circuit 1031, according to an operation state of the electric circuit device 101*a*. The transistor controller 114*a* outputs the activation signal 122 that drives or stops the detector 108. In this manner, the power consumption of the detector 108 in a standby state may be reduced. The standby state indicates a state where a connection between the load circuit and the power source does not change. The transistor controller 114*a* may be a computing unit for managing power consumption of the electric circuit device 101*a*, and may be called a Power Management Unit (PMU).

When the signal 1151 is output from the transistor controller 114*a*, the driver 1121 outputs the driving signal 1161. When the transistor 1021 initiates to turn on in accordance with the driving signal 1161, electric current for charging the capacitive element 1181 flows from the power supply line 104. Owing to the gate capacitance of the transistor 1021, the voltage of the driving signal 1161 varies continuously. Because the magnitude of electric current that flows between the source and drain of the transistor 1021 varies depending on the driving signal, which may be a gate voltage, the magnitude of electric current that flows from the power supply line 104 into the capacitive element 1181 also continuously varies.

As the magnitude of electric current that flows through the power supply line 104 varies over time, the power supply voltage fluctuates because of a transient phenomenon due to an inductance component and a resistive component in an electric current path such as the power supply line 104. When the voltage of the power supply line 104 decreases to a value, which is substantially equal to or smaller than a certain voltage that is set to the detector 108, because of the voltage fluctuations, the detector 108 outputs the detection signal 110 corresponding to the voltage. The driver 1121 receives the detection signal 110 and stops the output of the driving signal 1161. Even when the output of the driving signal 1161 is stopped, the transistor 1021 maintains gate voltage using the capacitive component, such as the gate capacitance of the transistor 1021, until the driving signal 1161 is output again. As a result, the fluctuation in the resistance value of the transistor 1021 may be reduced.

When the magnitude of electric current supplied from the power supply line 104 to the load circuit 1031 becomes substantially constant by maintaining the resistance value of the transistor 1021, the fluctuations in voltage due to a transient phenomenon is reduced. When the voltage of the power supply line 104 returns to a value substantially equal to or larger than the certain voltage of the detector 108, the detector 108 outputs the detection signal 110 in accordance with that voltage. The driver 1121 receives the detection signal 110 and outputs the driving signal 1161 again. The resistance value of the transistor 1021 decreases according to the driving signal 1161 and charges the capacitive element 1181 with a large electric current value.

By repeating the above-mentioned operation, the fluctuation in power supply voltage may be reduced to a certain range when supplying power voltage to load circuits.

Figure 2A:
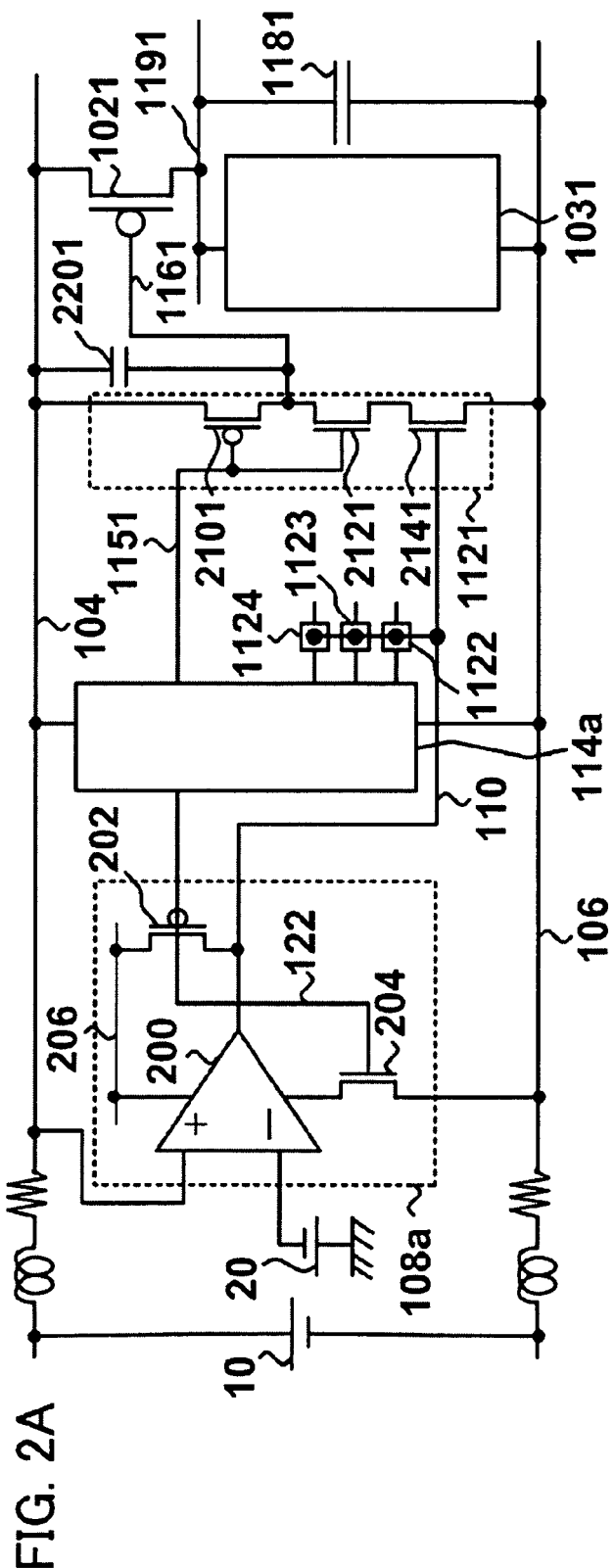
FIG. 2A illustrates an exemplary electric circuit device.
Figure 2B:
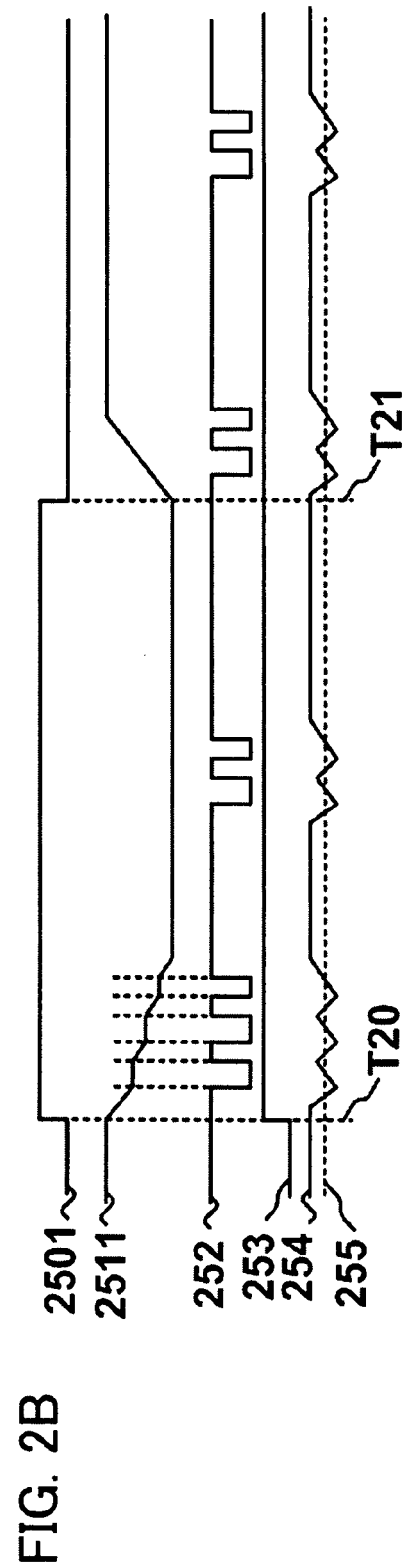
FIG. 2B illustrates an exemplary operation waveform chart.

FIG. 2A illustrates an exemplary electric circuit device. FIG. 2B illustrates an exemplary operation waveform chart of the electric circuit device. FIG. 2A illustrates the load circuit 1031 and circuits associated with the load circuit 1031. The other load circuits may be have the substantially same configuration. In FIG. 2A, the same components as those of the configuration illustrated in FIG. 1 are assigned with the same reference numerals, and description thereof may be reduced or omitted.

The detector 108*a* includes a comparator 200, a P-type MOS transistor 202 and an N-type MOS transistor 204. The positive input terminal of the comparator 200 is coupled to the power supply line 104, and the negative input terminal of the comparator 200 is coupled to a power source 20 that supplies a certain voltage. The comparator 200 outputs the detection signal 110. The logic of the detection signal 110 varies in accordance with the voltage of the power supply line 104. To accurately detect fluctuations in power, a power supply line 206 and the negative input terminal may be coupled to a power source that does not fluctuate in voltage. The comparator 200 outputs "0" as the detection signal 110 when a positive input voltage is substantially equal to or lower than a negative input voltage.

When the detector 108 does not need to operate, the transistor controller 114*a* outputs "0" as the activation signal 122. Thus, the P-type MOS transistor 202 turns on, and a signal "1" is output as the detection signal 110. The N-type MOS transistor 204 turns off, and the supply of power to the comparator 200 stops. A leakage current, which flows through the power supply line of the comparator 200 in a standby state, may be reduced.

A driver 1121 includes a P-type MOS transistor 2101 and N-type MOS transistors 2121 and 2141. The capacitive element 2201 may be a gate capacitance of the transistor 1021 or may be a capacitive element that is additionally coupled. The capacitive element 2201 is coupled to the power supply line 104. The capacitive element 2201 may be coupled to the power supply line 106 or may be coupled to the power supply line 1191. The capacitive element 2201 may have a capacitance that prevents the voltage from decreasing when the output of the driving signal 1161 is stopped. The gate terminal of the P-type MOS transistor 2101 and the gate terminal of the N-type MOS transistor 2121 are coupled to the transistor controller 114a. An inverter includes the P-type MOS transistor 2101 and the N-type MOS transistor 2121. The detection signal 110 is input to the gate terminal of the N-type MOS transistor 2141.

In FIG. 2B, a waveform 2501 indicates a voltage waveform of the signal 1151 output from the transistor controller 114a. A waveform 2511 indicates a voltage waveform of the driving signal 1161. As illustrated in the waveform 2501, when a period signal 1151 from time T20 to time T21 attains "1", the driver 1121 decreases a voltage of the driving signal 1161 as illustrated in the waveform 2511. At this time, there is no decrease in voltage of the power supply line 104, and the logic of the detection signal 110 output from the comparator 200 is "1". Since the logic of the signal 1151 attains "1", the gate voltage of the P-type MOS transistor 1021 initiates to decrease. In accordance with the decrease in voltage of the driving signal 1161, the electric current that flows from the power supply line 104 through the transistor 1021 to the load circuit 1031 and the capacitive element 1181 gradually increases.

A waveform 252 indicates a voltage waveform of the detection signal 110. A waveform 253 indicates a voltage waveform of the activation signal 122. A waveform 254 indicates a voltage waveform of power supplied to the power supply line 104. When the electric current that flows through the power supply line 104 varies over time, the power supply voltage fluctuates because of a transient phenomenon due to an inductance component and a capacitive component in an electric current path such as the power supply line 104. When the power supply voltage of the positive input is smaller than a negative input voltage as illustrated in the waveform 254 in the detector 108, the comparator 200 outputs "0" as the detection signal 110 as illustrated in the waveform 252. A waveform 255 represents a certain voltage that is input to the negative input terminal of the comparator 200.

The N-type MOS transistor 2141 of the driver 1121 turns off when the detection signal 110 having the logic of "0" is input to the gate of the N-type MOS transistor 2141. Since the logic of the signal 1151 is "1" and the P-type MOS transistor 2101 is also turned off, the driving signal 1161 of the transistor 1021 enters a floating state. The transistor 1021 has a capacitive component such as a gate capacitance. Because there is no path through which electric charge that is charged in the capacitive component discharges in a floating state, fluctuations in voltage of the driving signal 1161 before the N-type MOS transistor 2141 turns off may be reduced. In order to reduce fluctuations in voltage of the driving signal 1161, the capacitive element 2201 may be additionally coupled to the wire through which the driving signal 1161 is transmitted.

Fluctuations in on-resistance of the transistor 1021 may be reduced by a voltage of the capacitive component of the gate. The electric current that flows into the capacitive element 1181 and the load circuit 1031 becomes substantially constant. As a result, the fluctuations in voltage due to a transient phenomenon may be reduced, and the voltage of the power supply line 104 gradually returns. As the power supply voltage is larger than the certain voltage as illustrated in the waveform 254, the comparator 200 outputs "1" as the detection signal 110 as illustrated in the waveform 252.

When the detection signal 110 attains "1" and the N-type MOS transistor 2141 turns on, a voltage of the signal 1161 from the driver 1121 initiates to decrease again as illustrated in the waveform 2511. Since the electric current that flows into the capacitive element 1181 increases and the power supply voltage of the power supply line 104 decreases, the above operations may be repeated. The rage of decrease in voltage of the signal 1161 output from the driver 1121 may be automatically adjusted in accordance with a decrease in voltage of the power supply line 104. By repeating the above-mentioned operation, the fluctuation in power supply voltage may be reduced to a certain range when supplying power voltage to load circuits.

Figure 3:
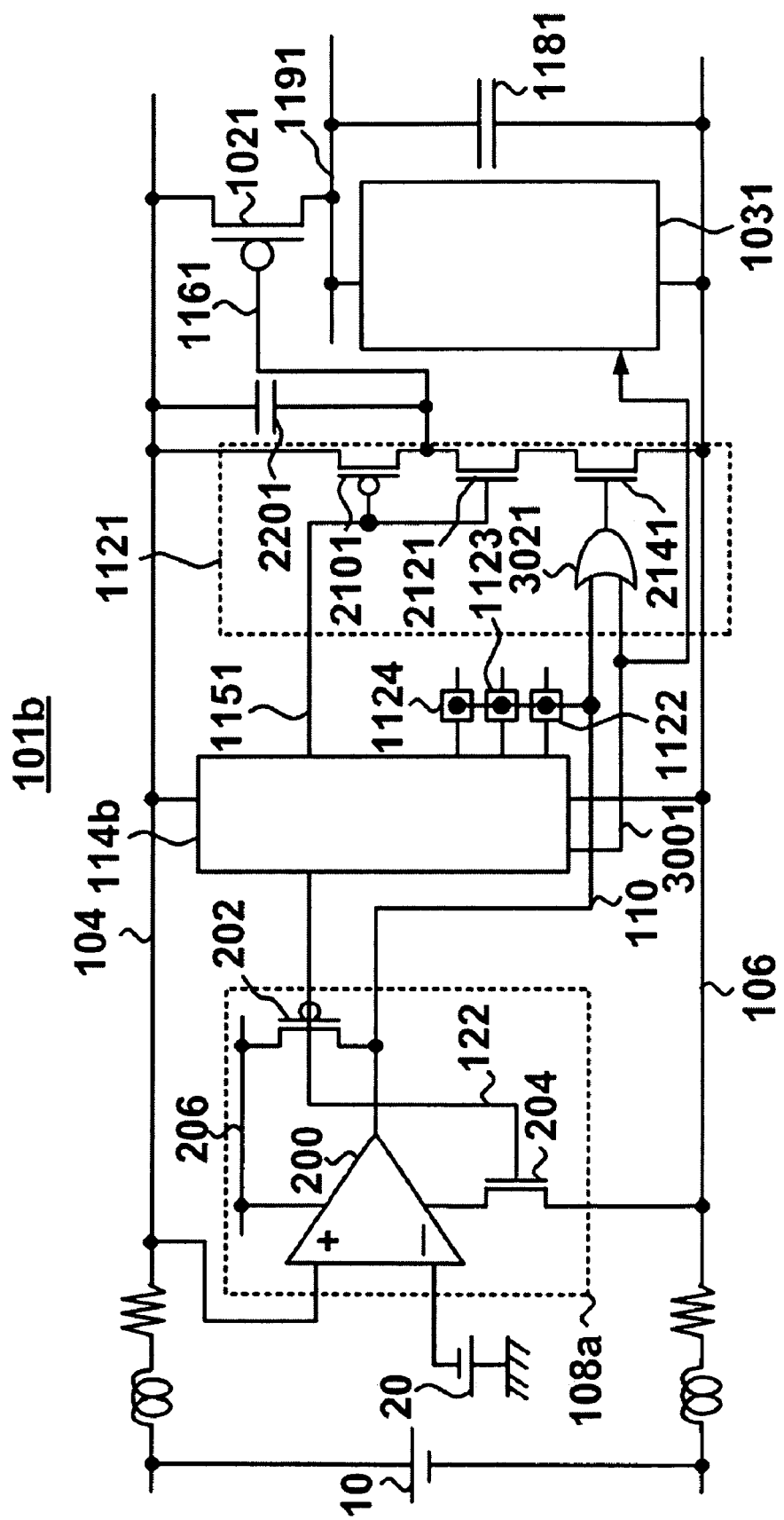
FIG. 3 illustrates another exemplary electric circuit device.

FIG. 3 illustrates an exemplary electric circuit device. In FIG. 3, the same components as those of the configuration illustrated in FIG. 2A are assigned with the same reference numerals, and description thereof is reduced or omitted.

An operation permission signal 3001 permits the load circuit 1031 to operate. The operation permission signal is provided for each load circuit, and is output from the transistor controller 114b to each load circuit.

A driver 1121 of FIG. 3 includes an OR circuit 3021 in addition to the driver 1121 of FIG. 2A. The OR circuit 3021 receives the detection signal 110 at one input and the operation permission signal 3001 at the other input. If the operation permission signal 3001 is "1", the N-type MOS transistor 2141 turns on irrespective of the detection signal 110.

When the load circuit 1031 is in operation, the power supply of the driver 1121 that supplies "0" to the transistor 1021 may be prevented from being blocked. Therefore the operation of the load circuit 1031 whose operation is being permitted may be stabilized.

Figure 4:
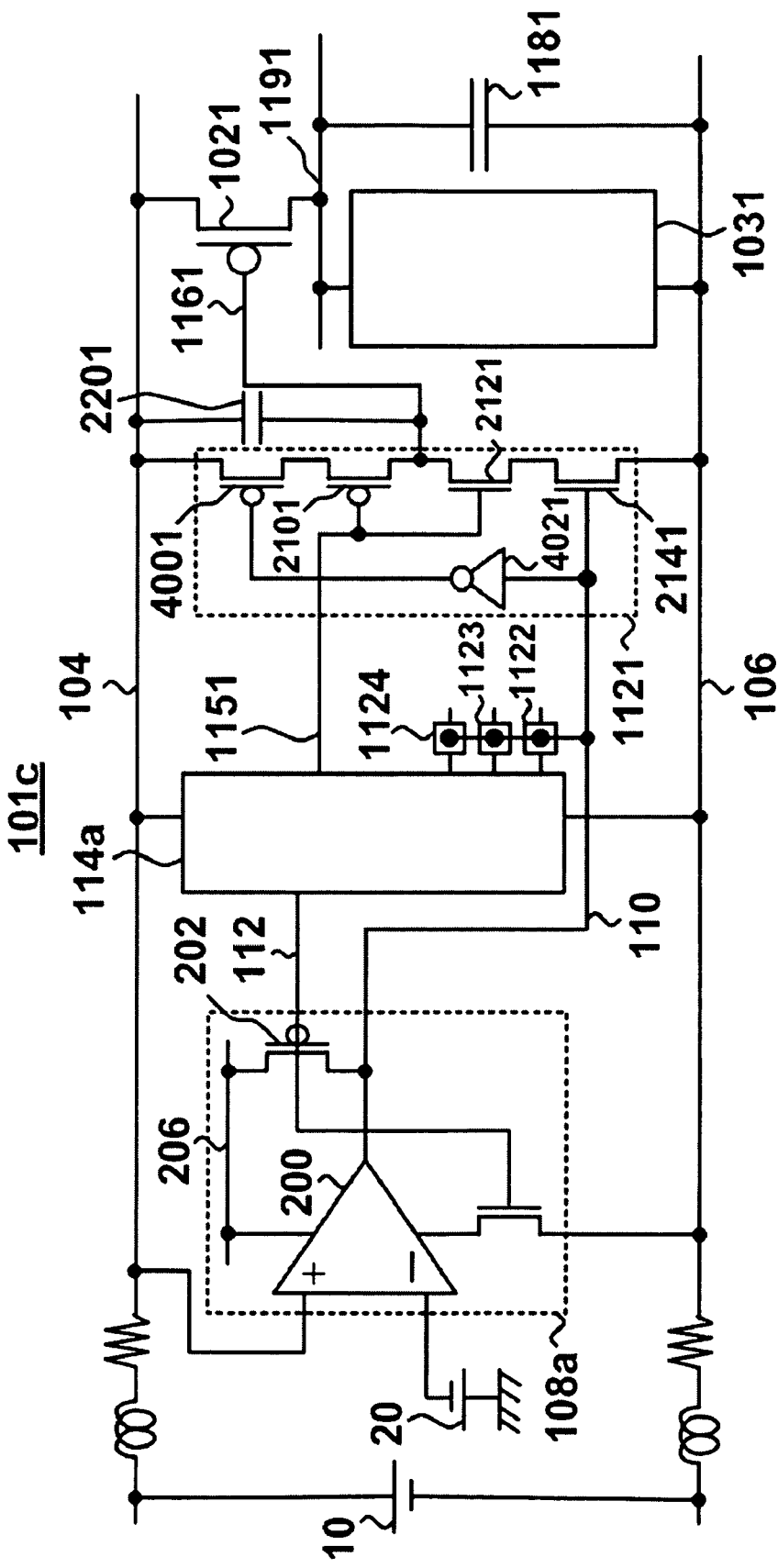
FIG. 4 illustrates another exemplary electric circuit device.

FIG. 4 illustrates another exemplary electric circuit device. The electric circuit device 101c includes a detector 108a, a transistor controller 114a, a driver 1121, a transistor 1021, a load circuit 1031 and a capacitive element 1181. In FIG. 4, the same components as those of the configuration illustrated in FIG. 2A are assigned with the same reference numerals, and description thereof is reduced or omitted.

The driver 1121 of FIG. 4 further includes, in addition to the driver 1121 of FIG. 2A, a P-type MOS transistor 4001 and a NOT circuit 4021. The P-type MOS transistor 4001 is coupled to the power supply line 104 and the P-type MOS transistor 2101. The NOT circuit 4021 received the detection signal 110 and outputs an inverted signal to the gate of the P-type MOS transistor 4001.

When the voltage of the power supply line 104 decreases to a value which is substantially equal to or smaller than a certain voltage, the detection signal 110 attains "1", and the transistors 4001 and 2141 of the driver 1121 turn off. Even when the transistor 1021 shifts from an off-state to an on-state or shifts from an on-state to an off-state, the driving signal 1161 of the transistor 1021 may be kept at a substantially constant value during a period when the detection signal 110 is at "1".

Figure 5:
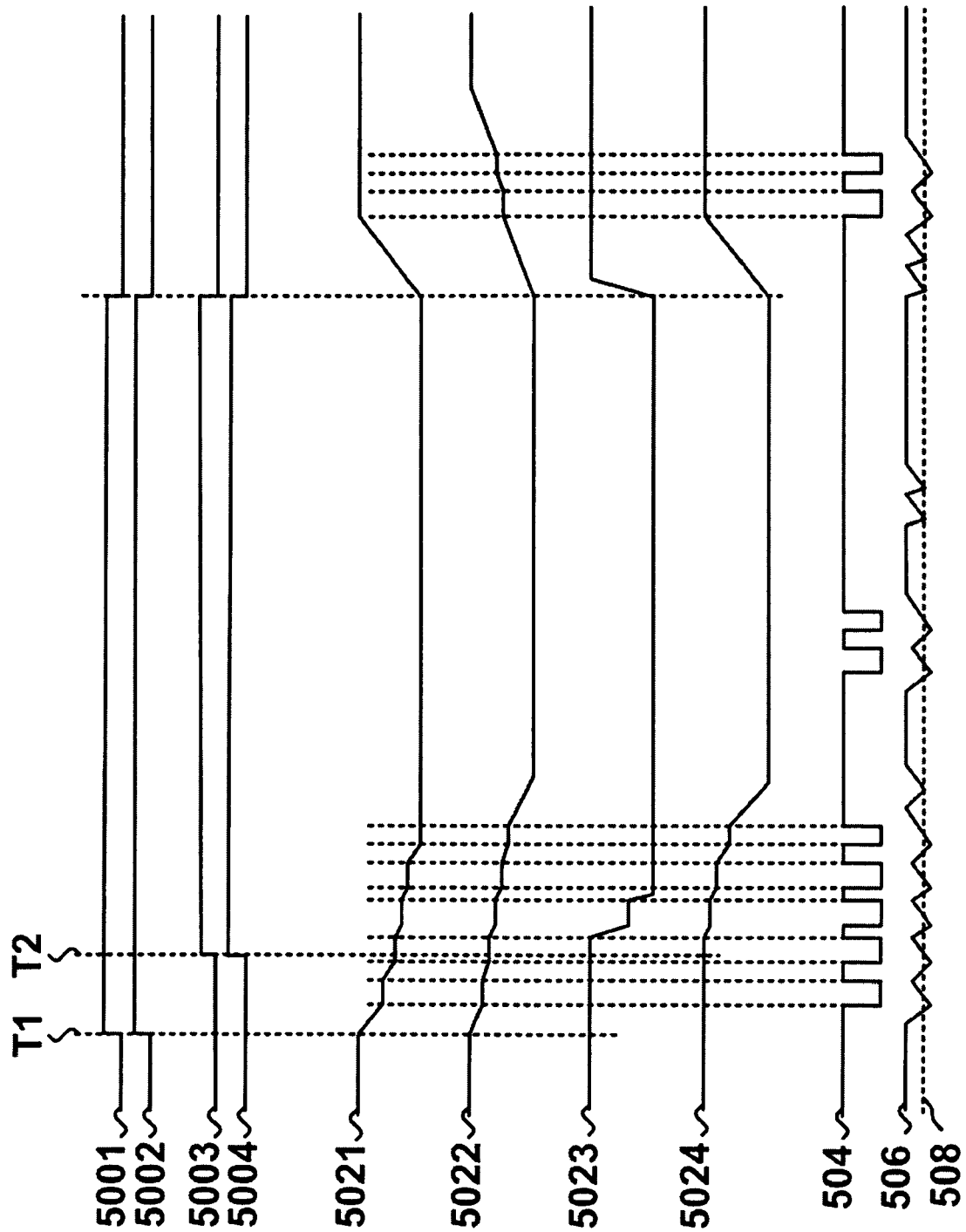
FIG. 5 illustrates an exemplary control waveform chart.

FIG. 5 illustrates an exemplary control waveform chart of the load circuit 1031, 1032, 1033, and 1034 by the electric circuit device 101c. The load circuits 1031, 1032, 1033 and 1034, although not illustrated in FIG. 4, have the substantially same configuration as the load circuit 1031. The circuit size of the load circuit 1032 is larger than that of the load circuit 1031. The circuit size of the load circuit 1033 is smaller than that of the load circuit 1031. The circuit size of the load circuit 1034 is substantially equivalent to that of the load circuit 1031. The gate capacitances of the transistors 1021, 1022, 1023, and 1024, although not illustrated, increase in proportion to the circuit size of the load circuit.

Waveforms 5001, 5002, 5003, and 5004 indicate voltage waveforms of transistor control signals 1151, 1152, 1153, and 1154 output from the transistor controller 114a. When the corresponding transistor control signals 1151, 1152, 1153, and 1154 shift from "0" to "1", the electric circuit device 101c initiates operation to turn on the load circuits 1031, 1032, 1033, and 1034.

Waveforms 5021, 5022, 5023, and 5024 indicate voltage waveforms of the driving signals 1161, 1162, 1163, and 1164. A waveform 504 indicates a voltage waveform of the detection signal 110. A waveform 506 indicates a power supply voltage waveform detected by the detector 108. A waveform 508 indicates a certain voltage of the detector 108. At time T1, signals 1151 and 1152 that are output from the transistor controller 114a contemporaneously attain "1" as illustrated in the waveforms 5001 and 5002. The voltages of the driving signals 1161 and 1162 gradually decrease as illustrates in the waveforms 5021 and 5022. Because the gate capacitances of the transistors 1021, 1022, 1023, and 1024 are different from one another, the rate of decrease in voltage also varies among them. As illustrated in the waveform 504, the detector 108 outputs the detection signal 110 at "0" during a period when the power supply voltage is substantially equal to or smaller than a certain voltage 508. The detection signal 110 is input to all the drivers 1121, 1122, 1123, and 1124 contemporaneously. When the detection signal 110 is at "0", the waveforms 5021 and 5022 hold the voltage before the detection signal 110 attains "0". This is because the N-type transistors 4021, 4022, 4023, and 4024 and the P-type transistors 4001, 4002, 4003, and 4004 turn off, the nodes of the drivers 1121, 1122, 1123, and 1124 that output the driving signals 1161, 1162, 1163, and 1164 enter floating state and the voltages are held by the parasitic capacitances of the transistors 1021, 1022, 1023, and 1024.

At time T2, the signals 1153 and 1154 that are output from the transistor controller 114a attain "1" as illustrated in the waveforms 5003 and 5004. The detector 108 detects a decrease in power supply voltage as illustrated in the waveform 504. The drivers 1121, 1122, 1123, and 1124 hold the voltages of the signals 1161, 1162, 1163, and 1164 before the detection signal 110 attains "0" as illustrated in the waveforms 5021, 5022, 5023, and 5024. Even when the plurality of load circuits initiate on operation at the same time, the rate of decrease in voltage of the signals 1161, 1162, 1163, and 1164 are automatically adjusted so as to be appropriate in accordance with the circuit sizes of the load circuits 1031, 1032, 1033, and 1034. As a result, an abrupt decrease in power supply voltage from the certain voltage may be prevented.

When the load circuit 1032 shifts from an on-state to an off-state, the voltage of the signal 1162 is held in accordance with decrease in power supply voltage as illustrated in the waveform 5022. As in the case where the load circuit 1032 enters an on-state, fluctuations in power is prevented when the load circuit 1032 enters an off-state.

Figure 6:
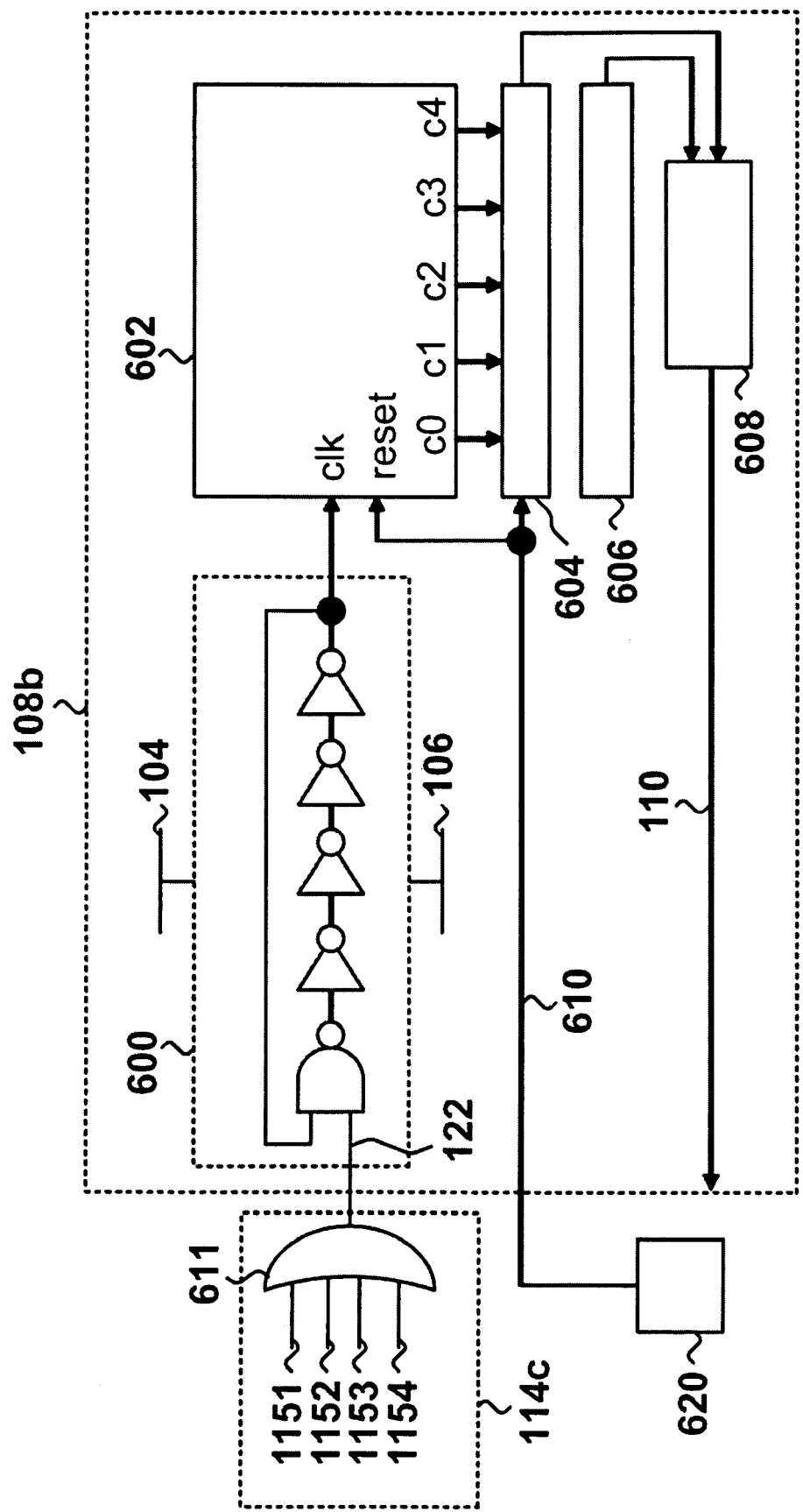
FIG. 6 illustrates an exemplary detector.

FIG. 6 illustrates an exemplary detector and an exemplary transistor controller. The transistor controller 114c includes an OR circuit 611 that outputs logical addition of the signals 1151, 1152, 1153, and 1154. The detector 108b includes a ring oscillator 600, a counter 602, a register 604, a storage unit 606, and a comparing unit 608.

The ring oscillator 600 includes an oscillator in which odd-numbered NOT circuits are coupled in series. The ring oscillator 600 receives the activation signal 122 output from the transistor controller 114c to output a oscillation signal having a constant period. The period of the oscillation signal oscillated from the ring oscillator 600 varies in accordance with fluctuations in power supply voltage of the power supply line 104.

The counter 602 counts the number of clocks of a clock output from the ring oscillator 600 in each clock period of a reference clock 610 output from a clock circuit 620. The oscillation cycle of the ring oscillator 600 may be represented in count value. The register 604 holds a count value counted by the counter 602, and outputs the count value to the comparing unit 608 in synchronization with the reference clock 610. The storage unit 606 includes a nonvolatile storage area, and stores a count value as a determination reference value for detecting a decrease in power supply voltage. The comparing unit 608 compares the count value of the register 604 with the count value stored in the storage unit 606, and then outputs the compared result as the detection signal 110. As a result, when the voltage of the power supply line 104 decreases and the count value of the number of clocks of the clock is smaller than the determination reference value, the detector 108b outputs the detection signal 110 having the logic "0".

In order to accurately detect fluctuations in voltage of the power supply line 104, the power supply line 206, which is independent of the power supply line 104 and has less fluctuations in power, may be provided. Because a substrate area of a semiconductor device is small, the power supply line is likely to be affected by fluctuations in power. The detector 108b may not need an additional power supply line. Therefore, mounting on the semiconductor device may be easy, and fluctuations in power may be detected accurately.

Figure 7:
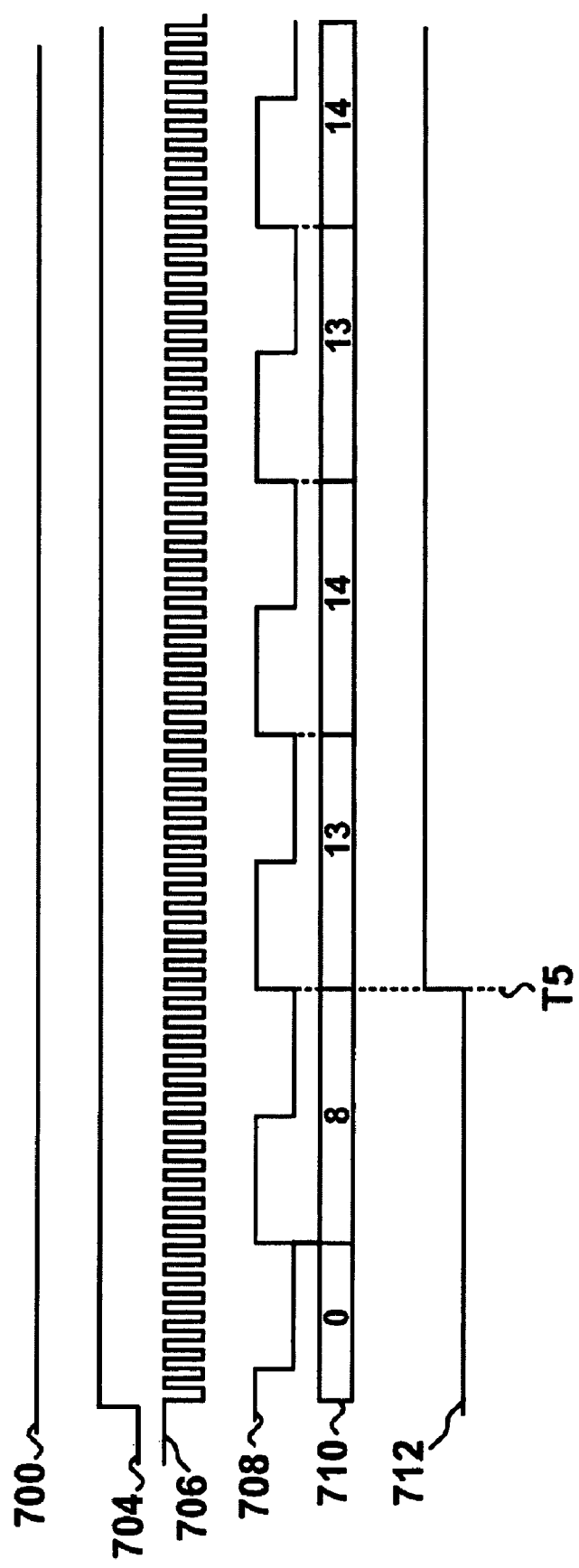
FIG. 7 illustrates an exemplary operation waveform chart.

FIG. 7 illustrates an exemplary operation waveform chart of the detector 108b illustrated in FIG. 6. A waveform 700 indicates a power supply voltage of the power supply line 104. A waveform 704 represents a variation in signal voltage of the activation signal 122. A waveform 706 indicates a clock waveform output from the ring oscillator 600. A waveform 708 indicates a clock waveform of the reference clock 610 supplied to the counter 602 and the register 604. The period of the reference clock 610 is substantially longer than the oscillation cycle of the ring oscillator 600. A waveform 710 represents the number of counts held in the register 604. A waveform 712 represents the detection signal 110 output from the comparing unit 608. For example, the count value "12" may be stored in the storage unit 606.

When the power supply voltage of the power supply line 104 does not fluctuate as illustrated in the waveform 700, the detector 108b operates as described below. When one of the signals 1151, 1152, 1153, and 1154 attains "1", the transistor controller 114c outputs the activation signal 122 having the logic "1". The ring oscillator 600 receives the activation signal 122 to initiate oscillating operation as illustrated in the waveform 706. The number of clocks of the waveform 706 is counted at each timing at which the waveform 708 rises, and is recorded in the register 604 as illustrated in the waveform 710. When the count value stored in the register 604 is substantially equal to or larger than the count value "12" stored in the storage unit 606 as illustrated in the waveform 710 at time T5, the comparing unit 608 outputs "1" as the detection signal 110 as illustrated in the waveform 712.

Figure 8:
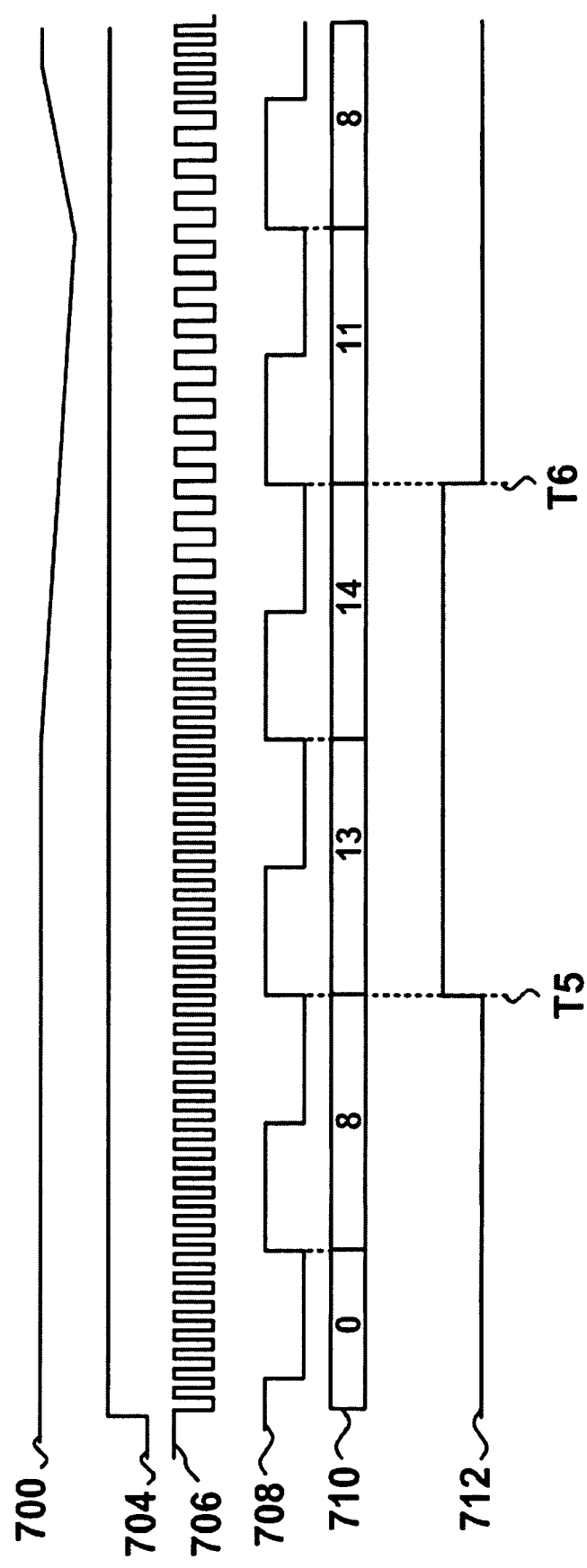
FIG. 8 illustrates another exemplary operation waveform chart.

FIG. 8 illustrates another exemplary operation waveform chart of the detector 108b illustrated in FIG. 6. FIG. 8 illustrates the operation when the power supply voltage of the power supply line 104 decreases to a value equal to or smaller than a certain voltage. FIG. 8 illustrates an operation that follows the operation illustrated in FIG. 7. The waveforms of the same signals are assigned with the same reference numerals and description thereof is reduced or omitted.

When the power supply voltage of the power supply line 104 decreases as illustrated in the waveform 700, the oscillation cycle of the ring oscillator 600 elongates as illustrated in the waveform 706. If the oscillation cycle elongates, the count value that is counted in each reference clock period and then stored in the register 604 reduces. When the count value stored in the register 604 becomes smaller than the count value "12" stored in the storage unit 606 at time T6, the comparing unit 608 outputs "0" as illustrated in the waveform 712. As a result, even when the detector 108b illustrated in FIG. 6 may be applied, the electric circuit devices 101a, 101b, and 101c operate as in the substantially same manner as described above.

Figure 9:
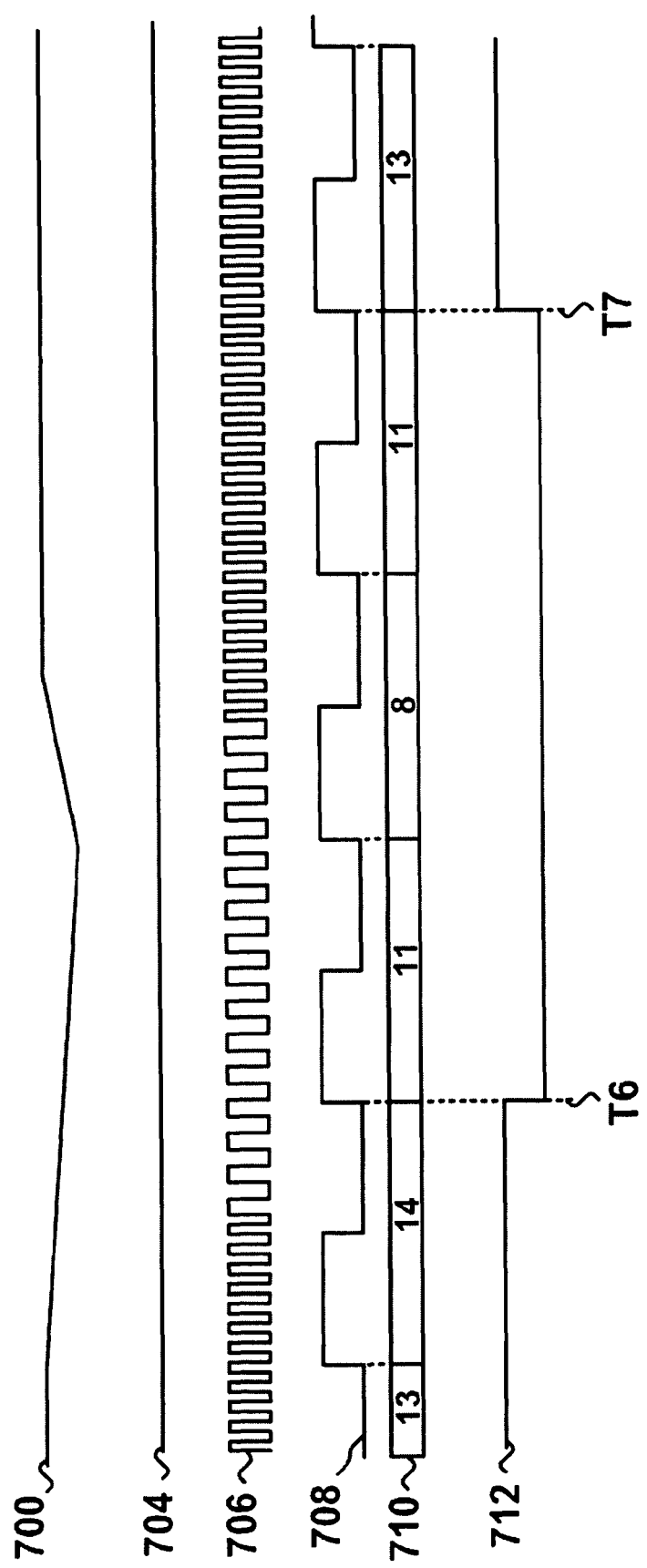
FIG. 9 illustrates another exemplary operation waveform chart.

FIG. 9 illustrates another exemplary operation waveform chart of the detector 108b illustrated in FIG. 6. FIG. 9 illustrates an operation when the power supply voltage of the power supply line 104 returns from a state where the power supply voltage of the power supply line 104 is smaller than the certain voltage to a state where the power supply voltage of the power supply line 104 is substantially equal to or larger than the certain voltage. FIG. 9 illustrates the operation that follows the operation illustrated in FIG. 8. The waveforms of the same signals are assigned with the same reference numerals and description thereof is reduced or omitted.

As the power supply voltage of the power supply line 104 returns as illustrated in the waveform 700, the oscillation cycle of the ring oscillator 600 shortens as illustrated in the waveform 706. When the oscillation cycle shortens, the count value that is counted in each reference clock period and then stored in the register 604 increases. When the count value stored in the register 604 is larger than the count value "12" stored in the storage unit 606 at time T7, the comparing unit 608 outputs "1" as illustrated in the waveform 712. Through the above operations, the detector 108b outputs the detection signal 110 in accordance with a decrease in power supply voltage. Thus, a electric current may be prevented from flowing into the load circuit when the power supply voltage decreases and an abrupt decrease in power supply voltage may be prevented.

Figure 10:
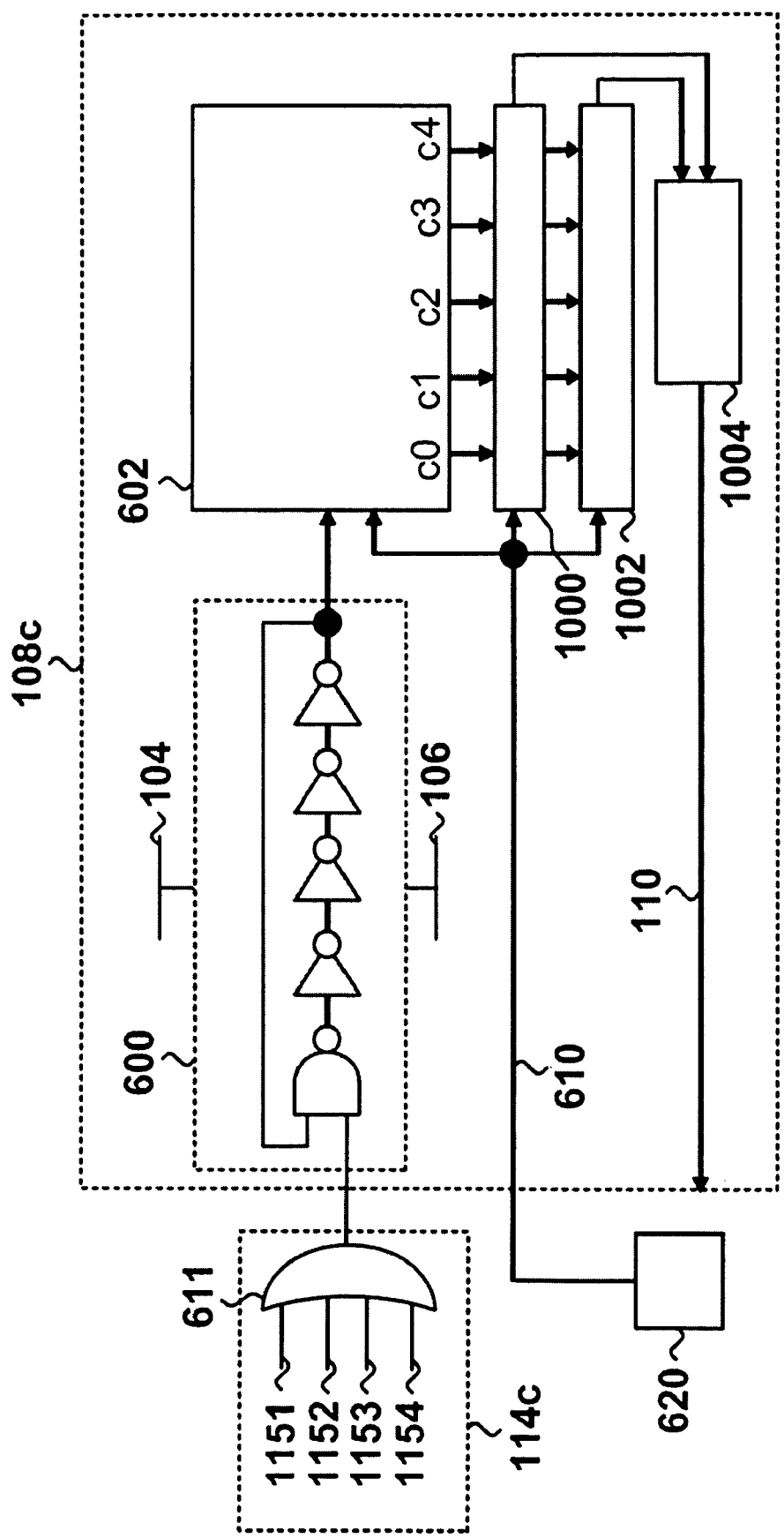
FIG. 10 illustrates an exemplary detector.

FIG. 10 illustrates an exemplary detector. The same components as those of the configuration illustrated in FIG. 6 are assigned with the same reference numerals, and description thereof is reduced or omitted. A register 1000 holds the count value output from the counter 602. The register 1000 outputs the held count value to a register 1002 and a comparing unit 1004 in accordance with the rising of the reference clock 610 output from the clock circuit 620. The register 1002 holds the count value output from the register 1000, and outputs the held count value to the comparing unit 1004 in accordance with the rising of the next reference clock 610. The comparing unit 1004 compares a value obtained by adding "1" to the count value output from the register 1000 with the count value output from the register 1002. The comparing unit 1004 holds the count value corresponding to the reference clock of the preceding period as a determination reference value. The comparing unit 1004 outputs "0" when the count value held in the register 1002 is larger than the obtained value, otherwise outputs "1". The value to be added to the count value output from the register 1000 may be "1" or more. The determination reference value may be a count value corresponding to the reference clock of two or more periods preceding from the current period.

An additional power supply line may not be provided in the detector 108c. Mounting on the semiconductor device may be easy, and fluctuations in power may be detected accurately.

By replacing the storage unit 606 of the detector 108b with the register 1002, the circuit size of the detector 108c may be reduced. A certain voltage to be stored in the storage unit 606 may not be set in accordance with the oscillation cycle of the ring oscillator 600, which is necessary for the detector 108b.

Figure 11:
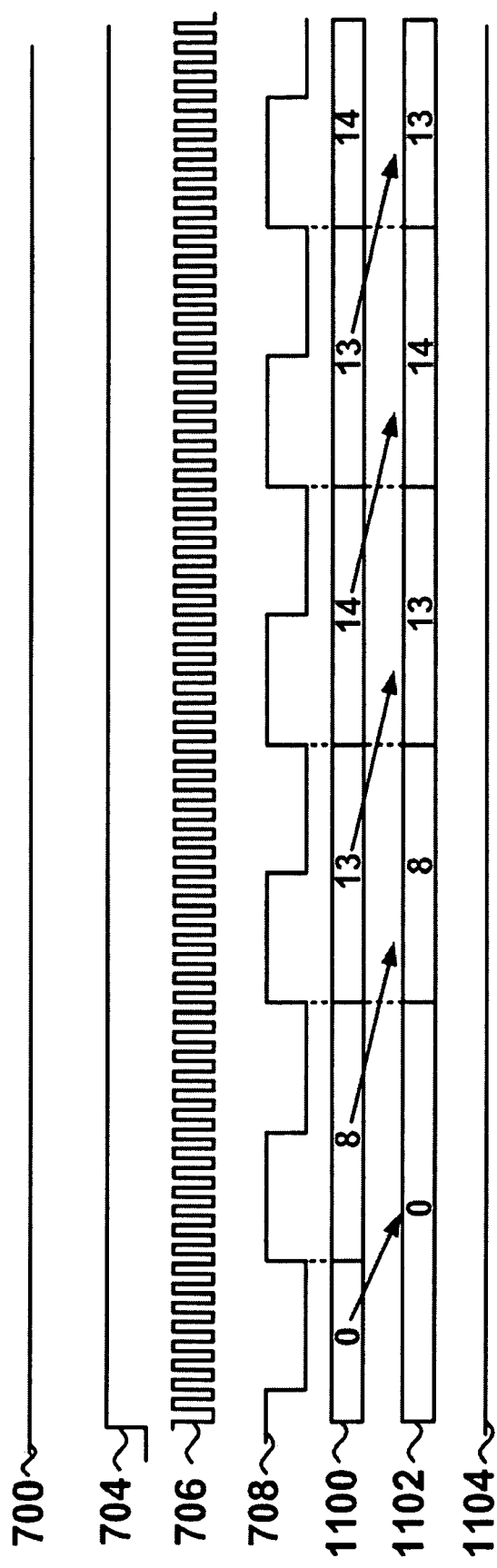
FIG. 11 illustrates an exemplary operation waveform chart.

FIG. 11 illustrates an exemplary operation waveform chart of the detector 108c illustrated in FIG. 10. In FIG. 11, the power supply voltage of the power supply line 104 may not fluctuate. The waveform 700 represents the power supply voltage of the power supply line 104. The waveform 704 represents the activation signal 122. The waveform 706 indicates a clock waveform output from the ring oscillator 600. The waveform 708 indicates a clock waveform of the reference clock 610 supplied to the counter 602 and the register 604. The period of the reference clock 610 is longer than the oscillation cycle of the ring oscillator 600. A waveform 1100 represents the number of counts held in the register 1000. A waveform 1102 represents the number of counts held in the register 1002. A waveform 1104 represents the detection signal 110 output from the comparing unit 1004.

When the logic "1" is output from the transistor controller 114c and the logic "1" is output as the activation signal 122, the ring oscillator 600 initiates oscillating operation as illustrated in the waveform 706. The number of clocks of the waveform 706 is counted at each timing at which the waveform 708 rises. The number of clocks is held in the register 1000 as illustrated in the waveform 1100. The count value held in the register 1000 is output to the register 1002 to be held in accordance with the rising of the next waveform 708.

When the power supply voltage is substantially constant as illustrated in the waveform 700, for example, the count values held in the registers 1000 and 1002 may be "13" or "14". The count value may not become constant because an error occurs in the period of the ring oscillator 600 or the reference clock 610. By comparing the value obtained by adding "1" to the value held in the register 1000 with the value held in the register 1002, fluctuations of the detection signal 110 output from the comparing unit 1004 may be prevented.

Figure 12:
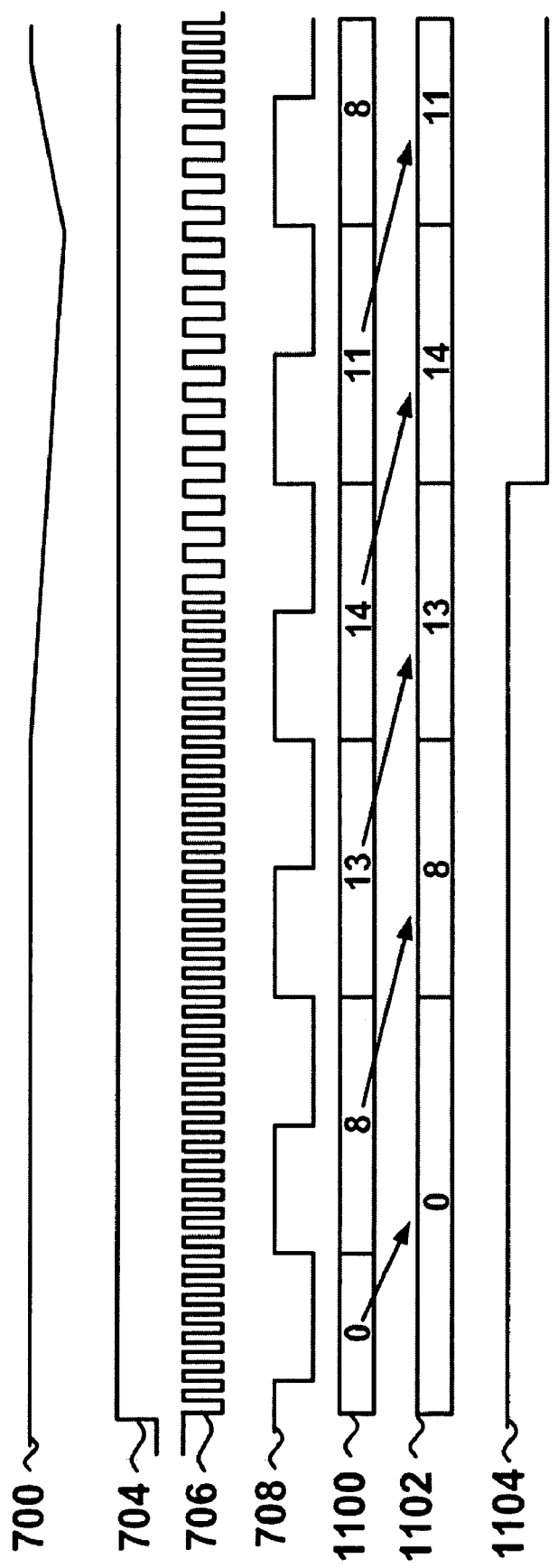
FIG. 12 illustrates another exemplary operation waveform chart.

FIG. 12 illustrates another exemplary operation waveform chart of the detector 108c illustrated in FIG. 10. FIG. 12 illustrates an operation waveform chart when the power supply voltage of the power supply line 104 decreases. The waveforms of the same signals as those in FIG. 11 are assigned with the same reference numerals and description thereof is reduced or omitted.

When the power supply voltage of the power supply line 104 decreases as illustrated in the waveform 700, the oscillation cycle of the ring oscillator 600 elongates as illustrated in the waveform 706. When the oscillation cycle elongates, the count value that is counted in each reference clock period and stored in the register 1000 reduces. When an value obtained by adding "1" to the count value held in the register 1000 is smaller than the count value held in the register 1002 at time T10, the comparing unit 608 outputs "0" as illustrated in the waveform 1104.

Figure 13:
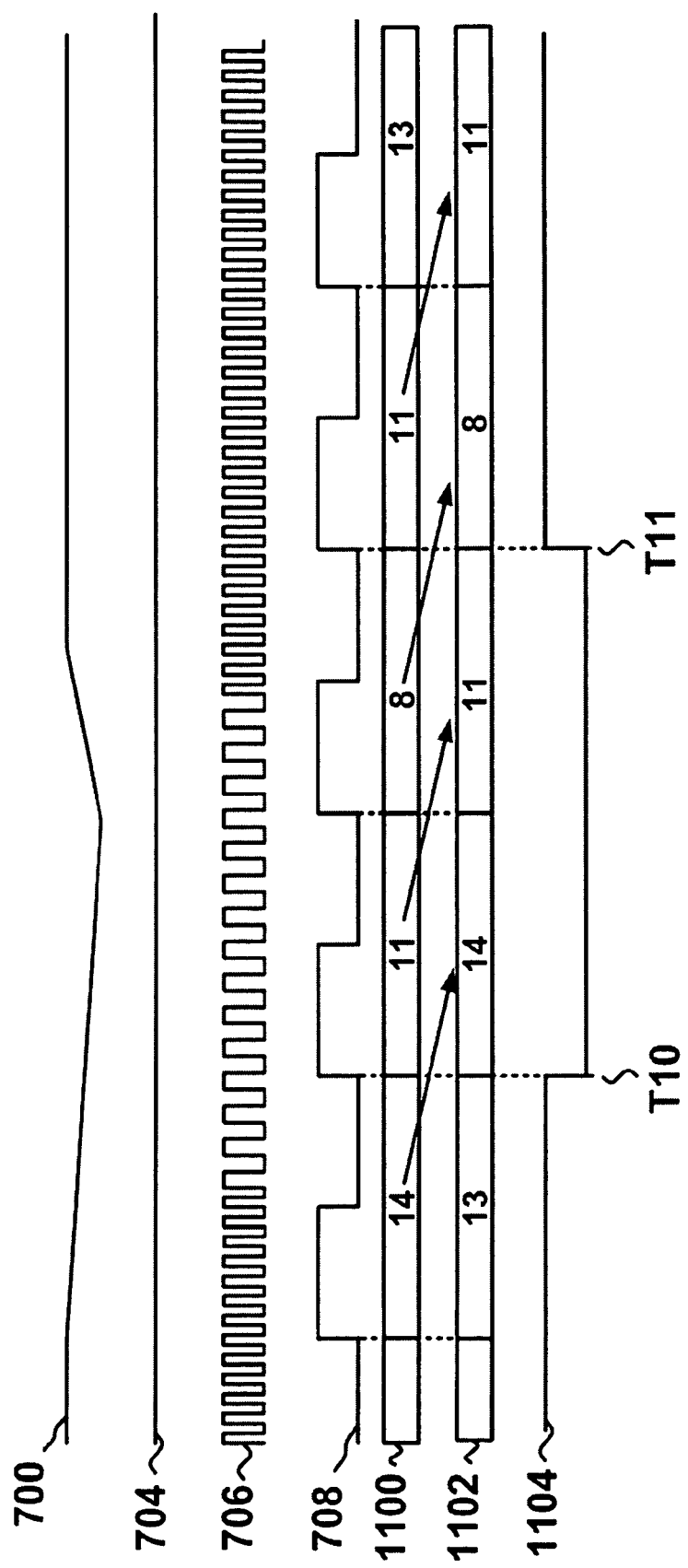
FIG. 13 illustrates another exemplary operation waveform chart.

FIG. 13 illustrates another exemplary operation waveform chart of the detector 108c illustrated in FIG. 10. FIG. 13 illustrates an operation when the power supply voltage of the power supply line 104 returns from a state where the power supply voltage of the power supply line 104 is smaller than the certain voltage to a state where the power supply voltage of the power supply line 104 is substantially equal to or larger than the voltage. FIG. 13 illustrates an operation that follows the operation illustrated in FIG. 12. The waveforms of the same signals are assigned with the same reference numerals and description thereof is reduced or omitted.

When the power supply voltage of the power supply line 104 returns as illustrated in the waveform 700, the oscillation cycle of the ring oscillator 600 shortens as illustrated in the waveform 706. When the oscillation cycle shortens, the count value that is counted in each reference clock period and then stored in the register 1000 increases. When a value obtained by adding "1" to the count value held in the register 1000 is larger than the count value held in the register 1002 at time T11, the comparing unit 1004 outputs "1" as illustrated in the waveform 1104. Through the above operations, the detector 108c outputs the detection signal 110 in accordance with a decrease in power supply voltage.

Figure 14:
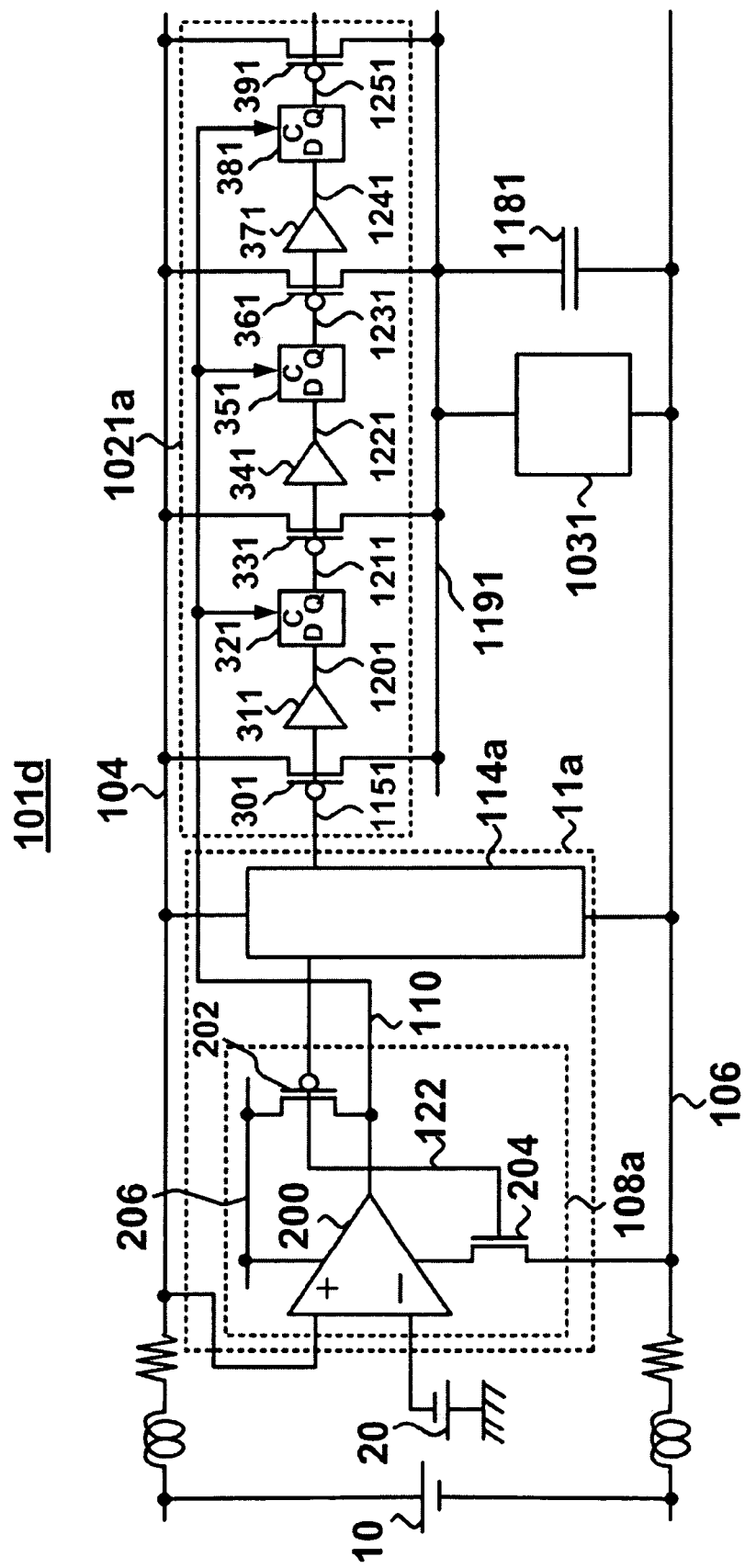
FIG. 14 illustrates a second embodiment.

FIG. 14 illustrates a second embodiment. The electric circuit device 101d illustrated in FIG. 14 includes a load circuit 1031 and associated circuits. The electric circuit device 101d may also include a plurality of other load circuits and other associated circuits. In FIG. 14, like reference numerals denote substantially like components to those of FIG. 2, and the description thereof is reduced or omitted.

The electric circuit device 101d includes power supply lines 104, 106 and 1191, the load circuit 1031, a capacitive element 1181, a current supply controller 11a and a current supply circuit 1021a. The current supply controller 11a monitors the voltage value of the power supply line 104, and outputs a result of comparison between the voltage value of the power supply line 104 and a certain threshold. The current supply circuit 1021a supplies electric current from the power supply line 104 to the load circuit 1031, and varies the electric current based on of a result of comparison of the current supply controller 11a while supplying electric current to the load circuit 1031.

The current supply controller 11a includes a transistor controller 114a and a detector 108a. The transistor controller 114a outputs a signal 1151 that controls current supply operation of the current supply circuit 1021a. The detector 108a outputs a detection signal 110 having logic corresponding to a result of comparison between a voltage value of the power supply line 104 and a threshold. In the second embodiment, the transistor controller 114a serves as a driver. In addition, in the second embodiment, the signal 1151 serves as a driving signal that drives the current supply circuit 1021a.

The current supply circuit 1021a includes a plurality of switches 301, 331, 361 and 391, a plurality of latch circuits 321, 351 and 381 and delay circuits 311, 341 and 371. The delay circuits 311, 341 and 371 delay the signal 1151. The latch circuits 321, 351 and 381 are provided between the delay circuits 311, 341 and 371 and the switches 331, 361 and 391, respectively, and hold an output signal based on the detection signal 110. The switches 301, 331, 361 and 391 may be P-type MOS transistors. However the switches 301, 331, 361 and 391 are not limited to the P-type MOS transistors.

The signal 1151 drives the switch 301. The signal 1151 is delayed by the delay circuit 311 and is output as a signal 1201. The signal 1201 is input to the latch circuit 321, and is output as a signal 1211 based on the detection signal 110 input to a terminal C of the latch circuit 321. The signal 1211 drives the switch 331. The signal 1211 is delayed by the delay circuit 341 and is output as a signal 1221. The signal 1221 is input to the latch circuit 351, and is output as a signal 1231 based on the detection signal 110 input to a terminal C of the latch circuit 351. The signal 1231 drives the switch 361. The signal 1231 is delayed by the delay circuit 371 and is output as a signal 1241. The signal 1241 is input to the latch circuit 381, and is output as a signal 1251 based on the detection signal 110 input to a terminal C of the latch circuit 381. The signal 1251 drives the switch 391. The switches 301, 331, 361 and 391 are respectively driven by the signal 1151 and the signals 1211, 1231 and 1251 having different phases from the signal 1151. Thus, the electric current that flows into the load circuit 1031 may be reduced when starting supply of power and thereby fluctuations in voltage of the power supply line 104 may be prevented.

For example, when the signal 1151 having the logic "0" is input to the gate terminal of the switch 301, the switch 301 turns on and then supply of electric current from the power supply line 104 to the load circuit 1031 is initiated. The signal 1151 is delayed in the delay circuit 311 for a certain period of time and then input to the latch circuit 321. A period of time delayed by the delay circuit 311 is longer than a period of time from time when the switch 301 turns on to time when the detector 108a detects the voltage of the power supply line 104 and supplies the detection signal 110 to the latch circuit 321. This prevents the next switch 331 from turning on before the detector 108a detects the voltage of the power supply line 104.

When the amount of fluctuations in voltage of the power supply line 104 at the time when the switch 301 turns on is smaller than or substantially equal to a threshold, the logic of the detection signal 110 input to the terminal C of the latch circuit 321 may be "1". When the logic of the detection signal 110 may be "1", the latch circuit 321 outputs the signal 1211 having the substantially same logic as that of the logic of the signal 1201 input to a terminal D from a terminal Q. The signal 1211 output from the terminal Q is input to the gate terminal of the switch 331, and then the switch 331 turns on. When the amount of fluctuations in voltage of the power supply line 104 at the time when the switch 301 turns on exceeds a threshold, the logic of the detection signal 110 input to the terminal C of the latch circuit 321 may be "0". When the logic of the detection signal 110 may be "0", the latch circuit 321 holds the logic of the signal 1211 irrespectively of the logic of the signal 1201 input to the terminal D, and continuously outputs from the terminal Q. The signal 1211 output from the terminal Q is input to the gate terminal of the switch 331, and then the switch 331 turns off. Operations of the switches 361 and 391, the delay circuits 341 and 371 and the latch circuits 351 and 381 are substantially the same or similar to the operations of the switch 301, the delay circuit 311 and the latch circuit 321.

When supply of power to the load circuit 1031 is stopped, the signal 1151 having the logic "1" may be input to the current supply circuit 1021a. The input signal 1151 is delayed by the delay circuits 311, 341 and 371 and sequentially turns off the switches 301, 331, 361 and 391. When fluctuations in voltage that exceed a threshold occurs in the power supply line 104 at the time when the switches 301, 331, 361 and 391 turn off, the latch circuits 321, 351 and 381 control turning off of the switches.

When supply of power to the load circuit 1031 is initiated, the magnitude of electric current that is supplied from the power supply line 104 to the load circuit 1031 is gradually varied in accordance with the amount of fluctuations in voltage of the power supply line 104. Thus, the amount of fluctuations in voltage falls within a certain range.

Figure 15:
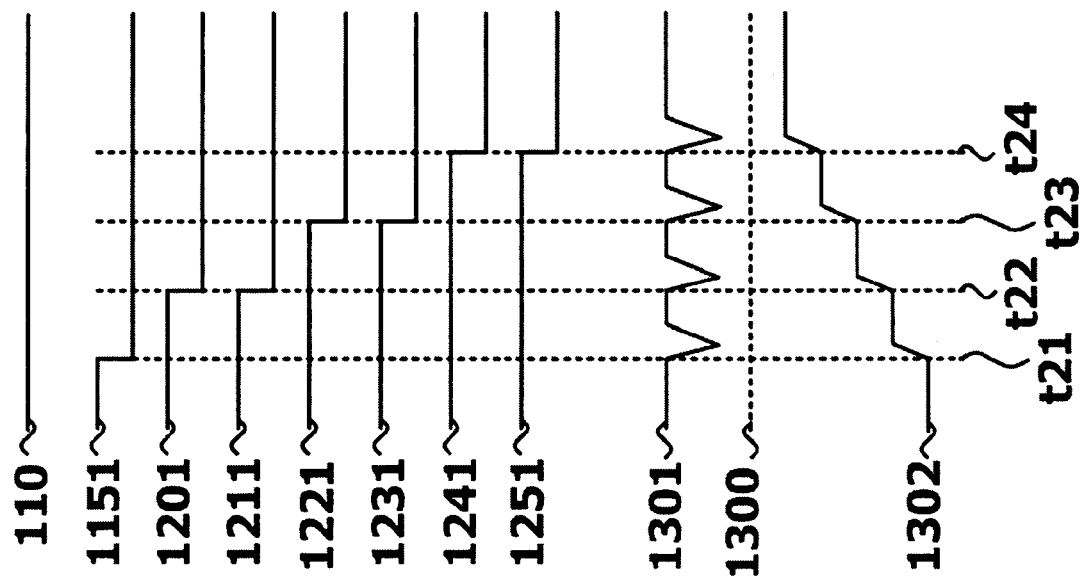
FIG. 15 illustrates an exemplary operation of a current supply circuit

FIG. 15 illustrates an exemplary operation of the current supply circuit 1021a when the amount of fluctuations in voltage of the power supply line 104 does not exceed a threshold. The waveforms illustrated in FIG. 15 indicate the waveforms of signals having the same sign in FIG. 14. The waveform 1300 indicates the voltage waveform of a threshold set in the detector 108a of FIG. 14. The waveform 1301 represents voltage noise that occurs in the power supply line 104. The waveform 1302 indicates the voltage waveform of the power supply line 1191.

When the signal 1151 attains the logic "0" at time t21, the voltage noise 1301 occurs in the power supply line 104. When the amount of fluctuations in the voltage noise 1301 is smaller than or substantially equal to the threshold 1300, the detection signal 110 may be the logic "1". The signal 1201 input to the latch circuit 321 is output as the signal 1211 at time t22. When the amount of fluctuations in the voltage noise 1301 is smaller than or substantially equal to the threshold 1300 at time t22, time t23 and time t24, the switches 301, 331, 361 and 391 sequentially turn on after a delay period of time set by the delay circuits 311, 341 and 371, respectively. The timings at which the switches 301, 331, 361 and 391 turn on are different from each other. Thus, the magnitude of electric current supplied from the power supply line 104 to the load circuit 1031 gradually varies in accordance with the amount of fluctuations in voltage of the power supply line 104, and the amount of fluctuations in voltage falls within a certain range.

FIG. 16 illustrates another exemplary operation of the current supply circuit 1021a when the amount of fluctuations in voltage of the power supply line 104 exceeds a threshold. The waveforms illustrated in FIG. 16 indicate the waveforms of signals having the same sign in FIG. 14. The waveform 1300 indicates the voltage waveform of a threshold set in the detector 108a of FIG. 14. The waveform 1301 represents voltage noise that occurs in the power supply line 104. The waveform 1302 indicates the voltage waveform of the power supply line 1191.

For example, when the signal 1151 attains the logic "0" at time t25, the voltage noise 1301 occurs in the power supply line 104. When the amount of fluctuations in the voltage noise 1301 that occurs at time t26 exceeds the threshold 1300, the detector 108a detects the noise and outputs the detection signal 110 having the logic "0" after a certain period of time has elapsed from t25. At time t27, when the signal 1201 having the logic "0", delayed by the delay circuit 311, is input to the terminal D of the latch circuit 321, the logic of the detection signal 110 input to the terminal C of the latch circuit 321 may be "0". When the logic of the detection signal 110 may be "0", the latch circuit 321 outputs the signal 1211 having the logic "1" irrespective of the logic of the signal 1201.

When the amount of fluctuations in the voltage noise 1301 is smaller than the threshold 1300, the detection signal 110 having the logic "1" may input to the latch circuit 321 at time t28 to which a certain period of time has elapsed. The latch circuit 321 outputs the signal 1211 having the logic "0" at time t28. The switch 331 turns on by the signal 1211. Since the switch 331 turns on, the amount of fluctuations in the voltage noise 1301 increases. Operations of the switches 361 and 391, the delay circuits 341 and 371 and the latch circuits 351 and 381 are substantially the same or similar to the operations of the switch 301, the delay circuit 311 and the latch circuit 321. When supply of power to the load circuit 1031 is initiated, the magnitude of electric current that is supplied from the power supply line 104 to the load circuit 1031 is gradually varied in accordance with the amount of fluctuations in voltage of the power supply line 104. Thus, the amount of fluctuations in voltage falls within a certain range.

Example embodiments of the present invention have now been described in accordance with the above advantages. It will be appreciated that these examples are merely illustrative of the invention. Many variations and modifications will be apparent to those skilled in the art.

The invention claimed is:

1. An electric circuit device comprising:
   a power supply line;
   a load circuit;
   a current supply controller which compares a voltage of the power supply line with a certain voltage;
   a current supply circuit which supplies an electric current from the power supply line to the load circuit and changes the electric current during a supply of the electric current;
   a detector which outputs a detection signal, the detection signal being determined in accordance with a comparative result from the current supply controller; and
   a driver which stops outputting the drive signal in accordance with the detection signal,
   wherein the current supply controller includes a first controller which outputs an activation signal to the detector, and wherein the detector operates and stops in accordance with the activation signal.

2. The electric circuit device of claim 1, wherein the current supply controller outputs a drive signal or stops outputting the drive signal based on a comparative result and includes a capacitive component which changes the electric current based on the drive signal and reduces change of the drive signal.

3. The electric circuit device of claim 1, wherein the detector fixes the detection signal while the detector stops in accordance with the activation signal.

4. The electric circuit device of claim 1, wherein the current supply controller includes a second controller which outputs a permission signal for operating the load circuit, and wherein the driver ignores the detection signal when receiving the permission signal.

5. The electric circuit device of claim 1, wherein the current supply controller includes a driver which output a drive signal for controlling the power supply circuit and a detector which outputs a detection signal based on a comparative result between the voltage of the power supply line and the certain voltage, and wherein the power supply circuit includes a delay circuit for outputting a first signal by delaying the drive signal, a latch circuit for outputting a second signal and latching the second signal based on the detection signal, a first switch to be driven by the drive signal and a second switch to be driven by the second signal.

6. An electric circuit device comprising:
   a power supply line;
   a load circuit;
   a current supply controller, coupled to the power supply line, which compares a voltage of the power supply line with a certain voltage;
   a current supply circuit which supplies an electric current from the power supply line to the load circuit and changes the electric current during a supply of the electric current;
   a detector which outputs a detection signal, the detection signal being determined in accordance with a comparative result from the current supply controller; and
   a driver which stops outputting the drive signal in accordance with the detection signal,
   wherein the detector compares an oscillation signal which changes in accordance with the voltage of the power supply line with a determination reference value and outputs the detection signal corresponding to a comparative result.

7. The electric circuit device of claim 6, wherein the detector includes a storage circuit which stores the determination reference value.

8. An electric circuit device comprising:
a power supply line;
a load circuit;
a current supply controller, coupled to the power supply line, which compares a voltage of the power supply line with a certain voltage;
a current supply circuit which supplies an electric current from the power supply line to the load circuit and changes the electric current during a supply of the electric current;
a detector which outputs a detection signal, the detection signal being determined in accordance with a comparative result from the current supply controller;
a driver which stops outputting the drive signal in accordance with the detection signal;
wherein the detector includes,
  an oscillator which outputs a oscillation signal in accordance with the voltage of the power supply line;
  a clock circuit which outputs a standard clock;
  a counter which counts in accordance with the oscillation signal;
  a first register which stores an output of the counter as a first count value in synchronization with a first edge of the standard clock;
  a second register which stores an output of the counter as a second count value in synchronization with a second edge of the standard clock; and
  a comparator which outputs a detection signal corresponding to a comparative result between the first count value and the second count value.

9. The electric circuit device of claim 8, wherein the detector compares the second count value to which a value is added with the first count value, the value being equal to or more than 1.

* * * * *